United States Patent
Seager et al.

[11] Patent Number: 5,840,620
[45] Date of Patent: Nov. 24, 1998

[54] METHOD FOR RESTORING THE RESISTANCE OF INDIUM OXIDE SEMICONDUCTORS AFTER HEATING WHILE IN SEALED STRUCTURES

[76] Inventors: Carleton H. Seager, 1304 Onava Ct., NE.; Joseph Tate Evans, Jr., 13609 Verbena Pl., NE., both of Albuquerque, N. Mex. 87112

[21] Appl. No.: 577,851

[22] Filed: Dec. 22, 1995

Related U.S. Application Data

[63] Continuation-in-part of Ser. No. 260,028, Jun. 15, 1994, abandoned.

[51] Int. Cl.$^6$ .......................... H01L 21/477; H01L 31/18
[52] U.S. Cl. .......................... 438/609; 257/749; 428/702; 438/795
[58] Field of Search .................... 437/247, 248, 437/944, 181; 428/701, 702; 148/DIG. 3; 257/749; 438/608, 609, 795

[56] References Cited

U.S. PATENT DOCUMENTS

| | | | |
|---|---|---|---|
| 3,447,234 | 6/1969 | Reynolds et al. | |
| 3,655,545 | 4/1972 | Gillery et al. | 204/192.29 |
| 4,202,917 | 5/1980 | Isuii et al. | 427/161 |
| 4,265,974 | 5/1981 | Gordon | 437/181 |
| 4,849,252 | 7/1989 | Arfsten et al. | 427/108 |
| 5,070,385 | 12/1991 | Evans et al. | |
| 5,264,077 | 11/1993 | Fukui et al. | 156/656.1 |

FOREIGN PATENT DOCUMENTS

| | | | |
|---|---|---|---|
| 217092 A2 | 4/1987 | European Pat. Off. | 437/181 |
| 60-1462 | 1/1985 | Japan . | |
| 63-74033 | 4/1988 | Japan . | |
| 1-187983 | 7/1989 | Japan | 437/181 |
| 3-212976 | 9/1991 | Japan | 437/181 |
| 4-320380 | 11/1992 | Japan | 437/181 |
| 6-88973 | 3/1994 | Japan | 437/247 |
| 59-177921 | 10/1994 | Japan | 437/181 |

OTHER PUBLICATIONS

S. Major et al. Appl. Phys. Lett. 49(7)(Aug. 1986)394 "... Hydrogen plasma treatment on transparent conducting oxides".
S. Yamamoto, et al., J. Vac. Sci. Technol., A5(4)(Jul. 1987)1952 "Properties of Sn–doped In 203 . . . and subsequent annealing".
A. Gupta et. al., Thin Solid Films 123(1985) 325–331 "Annealing Effects in Indium Oxide . . . ".
C. H. Lee et. al., Thin Solid Films 173(1989) 61–66 "Effects of Heat Treating and Iron Implantation on $In_2O_3$".

*Primary Examiner*—Charles L. Bowers, Jr.
*Assistant Examiner*—Leon Radomsky
*Attorney, Agent, or Firm*—Calvin B. Ward

[57] ABSTRACT

A method for counteracting increases in resistivity encountered when Indium Oxide resistive layers are subjected to high temperature annealing steps during semiconductor device fabrication. The method utilizes a recovery annealing step which returns the Indium Oxide layer to its original resistivity after a high temperature annealing step has caused the resistivity to increase. The recovery anneal comprises heating the resistive layer to a temperature between 100° C. and 300° C. for a period of time that depends on the annealing temperature. The recovery is observed even when the Indium Oxide layer is sealed under a dielectric layer.

1 Claim, 1 Drawing Sheet

METHOD FOR RESTORING THE RESISTANCE OF INDIUM OXIDE SEMICONDUCTORS AFTER HEATING WHILE IN SEALED STRUCTURES

This application is a Continuation-in-Part of U.S. patent application Ser. No. 08/260,028 filed Jun. 15, 1994, abandoned.

This invention was made with U.S. Government support under contract DEAC04-94AL8500awarded by the U.S. Department of Energy. The Government has certain rights in the invention.

FIELD OF THE INVENTION

The present invention relates to semiconductor fabrication techniques, and more particularly, to a method for restoring the resistance of Indium Oxide semiconductors after heating in the presence of oxygen.

BACKGROUND OF THE INVENTION

Memory devices based on Indium Oxide semiconductors deposited on lead zirconate titanates (PZT) are known to the prior art. For example, U.S. Pat. No. 5,070,385 describes a memory element comprising a layer of $In_2O_3$ deposited on a layer of PZT. Two contacts are provided on the $In_2O_3$ layer. If the PZT is polarized in one direction, the resistance between these contacts will be substantially different than the resistance measured if the PZT is polarized in the opposite direction.

Such memory devices often require an annealing step in which the device must be heated to temperatures in excess of 500° C. after the $In_2O_3$ is deposited thereon. The resistance of the $In_2O_3$ layer increases dramatically during this annealing step. This increase in resistance renders the devices inoperative for many applications.

The increase in resistance of $In_2O_3$ semiconductors when heated in the presence of oxygen is well known in the semiconductor arts. Indium tin oxide is often used as a substitute for $In_2O_3$ in those applications requiring heating in the presence of oxygen, since this increase in resistance does not manifest itself in Indium Tin Oxide until the temperature is raised to much higher levels. Unfortunately, Indium Tin Oxide cannot be used in place of $In_2O_3$ on PZT if the PZT is to be heated to the above-described temperatures because the Tin diffuses out of the Indium Tin Oxide and alters the PZT.

It is also known to the art that annealing indium oxide thin films in vacuum after the resistance has increased due to heating in air can restore the resistance of the film (Gupta, el al., "Annealing effects in Indium Oxide Films Prepared by Reactive Evaporation", Thin Solid Films, 123, pp. 325–331, 1985). Gupta, et al. observed that the resistance of the film decreases when heated in vacuum. While the exact mechanism by which these resistance alterations take place is not well understood, it is known that oxygen vacancies are the primary carriers in indium oxide semiconductors. Hence, it is not surprising that heating in the presence of oxygen or in vacuum affects the resistivity of the indium oxide film, since both of these operations alter the oxygen vacancies in the film. Heating in the presence of oxygen would be expected to decrease the oxygen vacancies by adding oxygen to the vacancies, and heating in a vacuum would be expected to increase the oxygen vacancies by allowing oxygen to escape from the film. The improvement in the resistance when the films are heated in vacuum is observed over a wide range of temperatures, the improvement increasing with temperature, at least for temperatures up to 350° C.

Unfortunately, vacuum annealing is not practical for indium oxide films that have been deposited on PZT. The properties of the PZT are altered by heating in vacuum after the PZT has been crystallized. Similar alterations occur with other oxygen containing ferroelectrics. These alterations substantially increase the rate at which information stored in the device is lost over time. To protect the PZT from such alterations, a dielectric layer, typically $TiO_2$ is placed over the PZT and indium oxide film thereby isolating the PZT and indium oxide film from whatever gas or lack of gas is present above the thin film. This dielectric layer is impervious to oxygen, and hence, would prevent the oxygen exchange described above.

Broadly, it is the object of the present invention to provide an improved method for using $In_2O_3$ semiconductors in conjunction with oxygen containing ferroelectrics.

It is a further object of the present invention to provide a method for lowering the resistance of an $In_2O_3$ layer after exposure to high temperatures while maintaining the PZT and $In_2O_3$ layers sealed in dielectric.

These and other objects of the present invention will become apparent to those skilled in the art from the following detailed description of the invention and the accompanying drawings.

SUMMARY OF THE INVENTION

The present invention utilizes a recovery annealing step which returns the $In_2O_3$ layer when deposited on PZT to its original resistivity after a high temperature annealing step has caused the resistivity to increase. The recovery anneal comprises heating the resistive layer to a temperature between 100° C. and 300° C. in the presence of oxygen for a period of time sufficient to cause the resistivity of the resistive layer to return to a predetermined value.

DETAILED DESCRIPTION OF THE INVENTION

Figure 1:
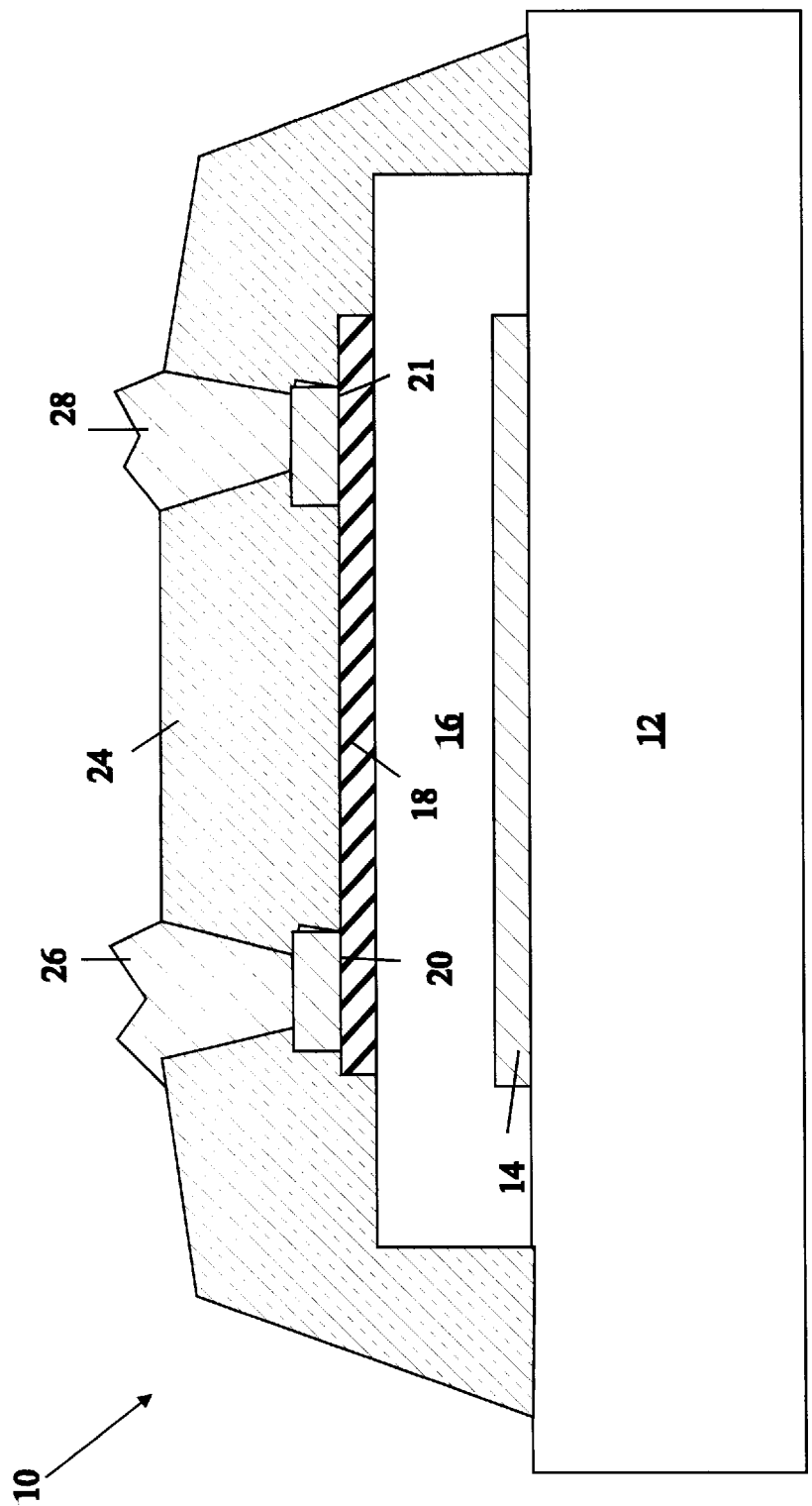
FIG. 1 is a cross-sectional view of a device that may be fabricated using the method of the present invention.

The present invention may be more easily understood with reference to the process flow for creating a memory device based on $In_2O_3$ on PZT. Refer to FIG. 1 which is a cross-section of a thin film ferroelectric transistor 10. Transistor 10 is constructed by depositing a bottom electrode 14 on a substrate 12. A PZT layer 16 is then deposited on bottom electrode 14. A semiconductor layer 18 is then deposited on PZT layer 16 and two contacts 20 and 21 provided on semiconductor layer 18. The electrical resistance of the circuit path between electrodes 20 and 21 is determined by the polarization of PZT layer 16. The polarization of the PZT layer is set by applying the appropriate potential difference between contacts 20 and 21 and bottom electrode 14.

To complete an integrated circuit part, a number of additional steps are needed after the deposition of semiconductor layer 18. In particular, the inter-layer dielectric layer 24 must be deposited over the circuit and vias opened to allow metallic connections to be made to contacts 20 and 21. These metallic connections are shown at 26 and 28. This process includes annealing steps that require that the entire circuit be heated to temperatures in excess of 500° C. As noted above, this heating step causes the $In_2O_3$ layer's resistivity to increase dramatically, thereby rendering the parts inoperative. In fact, substantial increases in resistivity are observed if the devices are heated to a temperature in excess of 400° C.

It should be noted that this increase in resistivity occurs even when the $In_2O_3$ is sealed under dielectric layer 24 which is preferably $TiO_2$. It should be noted that a $TiO_2$ layer is impermeable to oxygen. Hence, the observed increase in resistance has a mechanism that is likely to be different from that observed by Gupta, et aL Futhermore, since the $In_2O_3$ is sealed under dielectric layer 24, annealing in vacuum is not possible, since dielectric layer 24 prevents any oxygen from escaping from the $In_2O_3$ layer.

It has been found experimentally that the resistivity of the $In_2O_3$ layer may be returned to its normal range if the structure is subjected to a second "recovery anneal" at 200° C. after the high temperature annealing step described above. The parts are typically heated to 200° C. for one hour. In the preferred embodiment of the present invention, this "recovery anneal" is carried out after the parts have cooled from the last of the annealing steps described above that involve temperatures in excess of 500° C. However, it will be apparent to those skilled in the art, that the recovery anneal could be included in the last 500° C. annealing step by lowering the temperature after this anneal to 200° C. and then holding the parts at 200° C. for an hour before completing the cool down process.

While the above-described processing conditions represent the preferred embodiment of the present invention, it will be apparent to those skilled in the art from the above discussion that other combinations of annealing temperatures and annealing times will also function. As the temperature is lowered from the 200° C. conditions described above, the annealing time increases exponentially. However, recovery of resistivity has been demonstrated for temperatures as low as 100° C. Temperatures as high as 300° C. have also been found to provide the desired recovery of the resistivity. Above this temperature, the resistivity does not fully recover to its original value.

While the mechanism by which this recovery anneal operates to return the Indium Oxide to its original resistivity is not known, it is clearly different from the mechanism reported by Gupta, et al. Gupta, et al. observe a continuing improvement with temperature whereas the resistance clearly increases under the conditions utilized in the present invention if the temperature is raised above about 350° C.

While the above described embodiments of the present invention have been discussed in terms of a ferroelectric layer comprising of PZT, similar problems are encountered with other oxygen containing ferroelectrics. The optimum recovery anneal temperature and duration must be determined for each ferroelectric composition.

Various modifications to the present invention will become apparent to those skilled in the art from the foregoing description and accompanying drawing. Accordingly, the present invention is to be limited solely by the scope of the following claims.

What is claimed is:

1. In a method for the fabrication of a circuit element comprising the deposition of a semiconductor layer comprising Indium Oxide deposited on an oxygen containing ferroelectric sealed under a dielectric layer, followed by the heating of said semiconductor layer to a temperature in excess of 400° C., the improvement comprising the step of heating said semiconductor layer to a temperature between 100° C. and 300° C. and then cooling said circuit element to ambient temperature.

* * * * *